United States Patent [19]
Farnworth et al.

[11] Patent Number: 6,048,753
[45] Date of Patent: *Apr. 11, 2000

[54] STANDARDIZED BONDING LOCATION PROCESS AND APPARATUS

[75] Inventors: Warren M. Farnworth, Nampa; Alan G. Wood, Boise, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/023,826

[22] Filed: Feb. 13, 1998

Related U.S. Application Data

[63] Continuation of application No. 08/627,680, Apr. 2, 1996.

[51] Int. Cl.$^7$ .................................................. H01L 21/44
[52] U.S. Cl. ............................ 438/111; 438/612; 438/613
[58] Field of Search ..................... 267/786, 777, 267/775, 723, 730, 738, 673, 693, 697, 735, 725, 737; 438/111, 123, 612, 613, 614

[56] References Cited

U.S. PATENT DOCUMENTS

| | | |
|---|---|---|
| 4,772,936 | 9/1988 | Reding et al. . |
| 4,862,322 | 8/1989 | Bickford et al. ........................ 257/723 |
| 4,948,754 | 8/1990 | Kondo et al. . |
| 4,998,159 | 3/1991 | Shinohara et al. . |
| 5,082,802 | 1/1992 | Gelsumini ............................... 438/123 |
| 5,138,434 | 8/1992 | Wood et al. . |
| 5,147,815 | 9/1992 | Cagro ..................................... 438/123 |
| 5,168,345 | 12/1992 | Brossart . |
| 5,216,278 | 6/1993 | Lin et al. . |
| 5,239,198 | 8/1993 | Lin et al. . |

(List continued on next page.)

FOREIGN PATENT DOCUMENTS

| | | |
|---|---|---|
| 0486829 A2 | 5/1992 | European Pat. Off. . |
| 0692823 A1 | 7/1994 | European Pat. Off. . |
| 0 660 405 | 11/1994 | European Pat. Off. . |
| 0622847 A2 | 11/1994 | European Pat. Off. . |
| 0684644 A1 | 11/1995 | European Pat. Off. . |
| 0 704 900 | 9/1996 | European Pat. Off. . |
| 0 085 244 | 5/1982 | Japan . |
| 0 132 150 | 5/1989 | Japan . |
| 0 036 857 | 2/1993 | Japan . |
| 6-077293 | 6/1993 | Japan . |
| WO 97/37374 | 10/1997 | WIPO . |

OTHER PUBLICATIONS

European Search Report dated Jun. 2, 1999.
Patent Abstracts of Japan, Publicaton No. 05129366, dated May 25, 1993.
Patent Abstracts of Japan, Publication No. 59229850, dated Dec. 24, 1984.
"Activity Report of CSP Study Group" and "Chip Size Package" (two frames), JWG#2–8, San Diego, Jun. 1995, 1 page.
Letter from Avi Ben–Har to Warren Farnworth, dated Mar. 27, 1996 (1 page) transmitting on Mar. 28, 1996 a copy of Zilber, G., et al., *Slimcase—A Thin Chip Size, Intergrated Circuit Package* (8 pages), to have been presesnted at ISHM—MCM Conference, Denver Colorado, Apr. 18, 1996.
One (1) page copy of two overhead projections shown at a Semiconductor Industry Conference in San Diego, California in Jun., 1995.*

*Primary Examiner*—Kevin M. Picardat
*Attorney, Agent, or Firm*—Trask, Britt & Rossa

[57] ABSTRACT

A process for making a semiconductor device and the resulting device having standardized die-to-substrate bonding locations are herein disclosed. The semiconductor die provides a standardized ball grid or other array of a particular size, pitch and pattern such that as the size, configuration or bond pad arrangement of the die changes, a standard substrate, (the term including leadframes) having a similarly standardized array of terminals or trace ends can be employed to form a semiconductor device. It is also contemplated that dice having markedly different circuitry but a common array pattern may be employed with the same substrate or other carrier.

7 Claims, 6 Drawing Sheets

U.S. PATENT DOCUMENTS

| | | |
|---|---|---|
| 5,281,151 | 1/1994 | Arima et al. . |
| 5,289,346 | 2/1994 | Carey et al. . |
| 5,291,062 | 3/1994 | Higgins, III . |
| 5,311,057 | 5/1994 | McShane . |
| 5,327,008 | 7/1994 | Djennas et al. . |
| 5,334,857 | 8/1994 | Mennitt et al. . |
| 5,355,283 | 10/1994 | Marrs et al. . |
| 5,365,409 | 11/1994 | Kwon et al. . |
| 5,376,825 | 12/1994 | Tukamoto et al. . |
| 5,379,191 | 1/1995 | Carey et al. . |
| 5,384,487 | 1/1995 | Rostoker et al. . |
| 5,399,903 | 3/1995 | Rostoker et al. . |
| 5,424,492 | 6/1995 | Petty et al. . |
| 5,438,224 | 8/1995 | Papageorge et al. .................. 257/723 |
| 5,440,171 | 8/1995 | Miyano et al. . |
| 5,454,160 | 10/1995 | Nickel . |
| 5,483,101 | 1/1996 | Shimoto et al. . |
| 5,490,040 | 2/1996 | Gaudenzi et al. . |
| 5,490,324 | 2/1996 | Newman . |
| 5,497,397 | 3/1996 | Hershey et al. . |
| 5,498,767 | 3/1996 | Huddleston et al. . |
| 5,502,289 | 3/1996 | Takiar et al. . |
| 5,506,756 | 4/1996 | Haley . |
| 5,521,435 | 5/1996 | Mizukoshi . |
| 5,523,622 | 6/1996 | Harada et al. . |
| 5,593,927 | 1/1997 | Farnworth et al. . |
| 5,604,379 | 2/1997 | Mori . |
| 5,643,830 | 7/1997 | Rostoker et al. . |
| 5,646,828 | 7/1997 | Degani et al. . |
| 5,677,576 | 10/1997 | Akagawa . |
| 5,683,942 | 11/1997 | Kata et al. . |
| 5,715,144 | 2/1998 | Ameen et al. . |
| 5,726,489 | 3/1998 | Matsuda et al. . |
| 5,741,729 | 4/1998 | Selna . |
| 5,817,986 | 10/1998 | Davidson et al. . |
| 5,844,304 | 12/1998 | Kata et al. . |

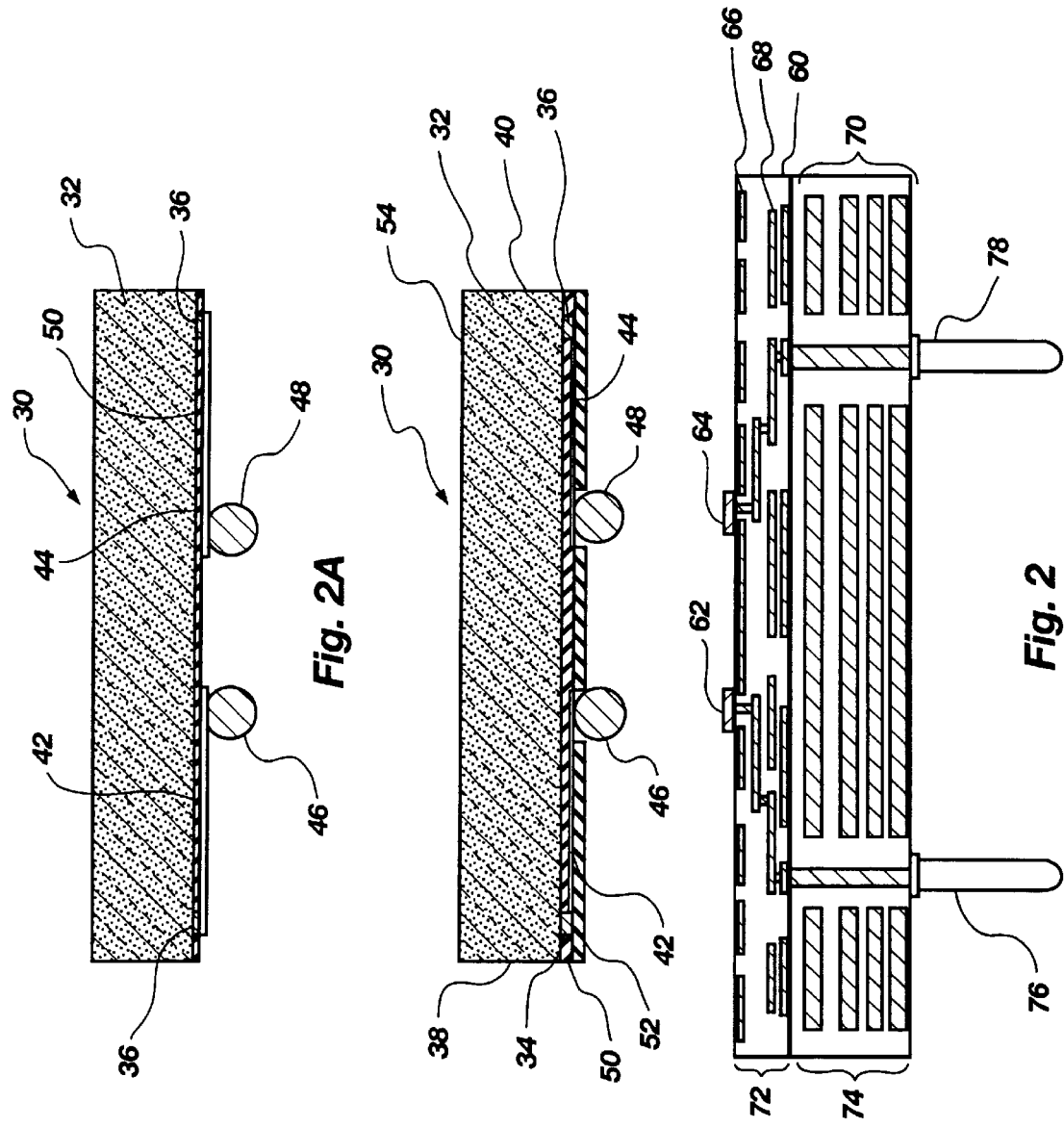

STANDARDIZED BONDING LOCATION PROCESS AND APPARATUS

This application is a continuation of U.S. patent application Ser. No. 08/627,680, filed on Apr. 2, 1996.

BACKGROUND OF THE INVENTION

1. Field of the Invention

This invention relates generally to a process for forming semiconductor die-to-substrate conductor interconnections and, more specifically, to a process for forming standardized bonding locations for varying die sizes, configurations, bond pad arrangements and circuitry, and a semiconductor die assembly formed therefrom.

2. State of the Art

The first integrated circuits became available in the late 1960s having a minimal number of circuits on each chip of silicon. These first components typically included aluminum or gold-based thin-film traces to integrate the active and passive devices embedded in the silicon. Since these first simple semiconductor devices, the circuit count per die has grown exponentially. In the early 1970s, bipolar logic chips had about 100 circuits and monolithic memory had 128 bits forming the first commercial, bipolar main memory. Since. then, the number of logic circuits has grown to over 10,000 per chip (bipolar) and one gigabit memory chips, with FET transistors replacing bipolar.

The active component or device integration and densification process in integrated circuits has motivated a continuous and ongoing migration of intercircuit wiring and connections from boards, cards, and modules to the chip itself. The surface of the chip, with its multilayer wiring, has become a microcosm of the conductor and insulator configurations that were common on previous multilayer printed circuit boards and multilayer ceramic packages. A logic chip with 700 circuits and three layers of wiring has approximately 5 m of aluminum wiring on a chip less than 5 mm square. There are over 17,000 via connections from level to level through a micron-tlhick insulator film of $SiO_2$. Yet, the conductor capacity in the chip greatly lags behind the densification of the silicon devices. Most of the area of the chip (approximately two-thirds), still serves as a platform for the wiring.

Heretofore, serial wirebonding of one or two rows of bond pad input/outputs (I/Os) around the perimeter or down the center of the chip to leads and sometimes buses of a leadframe has satisfied the needs of most ceramic or plastic dual in-line packages. Automated wirebonding today is very fast, efficient, and reliable compared to the manual bonding of the 1960s. Wirebonding, however, appears to be yielding for some applications to TAB bonding, in which the density of perimeter connections can be doubled or tripled and all bonds made simultaneously. Solder-bumped connections have evolved into an area array or pattern configuration in which a large portion of the surface of the chip is covered with controlled collapse chip connections (C4s) for the highest possible I/O counts. Unlike wirebonding, C4 usually dictates solder bump formation on the active surface of the chip when the chip is in wafer forn. Typically, in such structures, a layer of silicon oxide, silicon nitride, or polyimide passivation must be formed over the final wiring level on the active surface of the chip before formation of the bumps. This has become a commonplace precaution to protect the fine wiring from corrosion and mechanical damage, even in advanced wirebonded chips.

Solder-bump interconnection was initiated in the early 1960s to eliminate the expense, unreliability, and low productivity of manual wirebonding. Whereas the initial, low-complexity, low circuit density chips typically required only peripheral contacts or bond pads, solder-bump technology has allowed considerable extendibility in I/O density as it progressed to full-population area arrays. Typically, C4s utilize solder bumps deposited on wettable metal pads on the chip and a matching footprint of solder wettable terminals at the ends of circuit traces carried by the substrate. The upside-down chip (commonly referred to as a "flip chip") is aligned to the substrate, and all joints are made, simultaneously by reflowing the solder. It is also known to employ conductive polymer bumps or polymers loaded with conductive particles in lieu of solder bumps in arrays. Fine pitch bump arrays have been generally termed "ball grid arrays," or "BGAs," in the art.

In addition to the densification of C4s or other conductive bumps on a given die (also interchangeably referred to in the art as a "chip"), technological advances in the art have decreased the overall size of semiconductor dice (for a given circuit density). Further, due to ongoing advances in circuit component design and fabrication technology, a given die may be "shrunk" one or more times during its commercial lifesl)an to enhance per-wafer yield, device speed and performance, and quality. In addition, similar dice from different manufacturers may be of different sizes and/or shapes, but are adaptable to use on the same printed circuit board or other conductor-carrying substrate. Consequently, the need to allow for varying sized dice for a given substrate has been recognized. For example, U.S. Pat. No. 5,168,345 discloses a substrate having a plurality of conductive leads arranged in a generally radial pattern to which dice of various sizes may be attached. Likewise, in U.S. Pat. No. 5,327,008, a universal leadframe is disclosed which is suitable for use with many different die sizes. In both of the foregoing patents, bond wires are employed to connect die bond pads to leadframe leads.

Such arrangements, however, are not practical for bump-type interconnections (flip-chip bonding) of dice having markedly different bond pad patterns thereon, due to the precise mutual locational requirements of the bump interconnections and the matching terminals or other connector structures on a substrate or other carrier. Thus, it would be advantageous to provide a bumped die to which a standardized array of terminals or trace ends of a substrate or other carrier such as a leadframe could be bonded, regardless of die size or bond pad pattern. Thus, a single substrate or leadframe conductor configuration might be employed to accommodate different generations of the same die or different dice altogether.

SUMMARY OF THE INVENTION

Accordingly, the present invention comprises a process of making a semiconductor die having a standardized array of external connections formed thereon, and the resulting dice and die assembly. That is, a given semiconductor die has a set pattern, pitch and size (also termed an "array") of external connections formed on its active surface so that it may physically and electrically mate with a substrate or other carrier having a substantially identical standardized array of trace ends, terminals or other contact structures. As the size of the die is reduced during product development, the newly formed die (commonly referred to as a "shrink") has the same configuration and size of array of external connections formed thereon for joining with a substrate. Thus, a single substrate trace end or terminal configuration matching the external connection pattern of the first, over-size generation of a given die will also be usable for subsequent generations of smaller dice.

Similarly, dice from different manufacturers or other dice having differing bond pad patterns may be reconfigured according to the invention with identical I/O bump patterns. For example, a die with two parallel rows of peripheral bond pads, a die with one or two central rows of pads, a die with a hybrid pad pattern of a central pad row with a transverse peripheral row of pads at each end, and a die with pads along all four sides may be reconfigured to a common I/O array pattern.

The die of the invention has a plurality of external contact or connect (bond) pads formed on its surface, to which a plurality of external connections residing on the die is connected by conductive traces extending between the contact pads and the external connections. The contact pads and traces may be at least partially covered by a dielectric material, such as a polyimide or other suitable material known in the art.

In a preferred embodiment, the size of the die employing a standardized external connection (I/O) array can be reduced at least twice for a given integrated circuit device, one such exemplary device being a sixty-four megabit dynamic random access memory (DRAM) die. Moreover, the die size can be reduced in one lateral (x,y) dimension or two without compelling a change in the arrangement of the standardized connection array.

In one preferred embodiment, the I/O array is organized in a series of substantially mutually parallel rows and perpendicular columns. In another embodiment, the array is organized in a pattern of parallel rows with I/O connections of each row offset from an adjacent one. In yet another embodiment, the array forms a substantially rectangular configuration with interconnections positioned only about the perimeter of the rectangle.

In yet another embodiment, the array is organized into at least one row of connectors. If one row is utilizd, the row may be formed along a center line of the die, along a side or anywhere in between. If two rows are utilized, the rows may be adjacent one another flanking a center line of the die, proximate opposing sides of the die, or flanking one side of the die with I/O connections of each row offset to minimize pitch.

In still another embodiment, the I/O array is configured with one or two central rows of connections having a transverse row of connections at one or both ends thereof along a side of the die.

In a further embodiment, the I/O array is of circular configuration, employing one or more concentric rings of connections.

A significant aspect of the invention is that any selected single, standardized trace-end array pattern substrate can be utilized for succeeding generations of ever-smaller semiconductor dice including substantially the same integrated circuit, or a circuit that "looks" the same electrically to external devices. That is, regardless of the specific external connection configuration, the layout of external connections remains constant for subsequent reduced-sized, or shrunken, die.

Another significant aspect of the invention is the ability to interchange dice of different manufacture and having different bond pad arrangements by standardizing their external connections.

Still another significant aspect of the invention is the ability to mount dice with markedly differing bond pad arrangements to a single leadframe having inner lead ends configured to contact the bond pads of each die. Such interchangeability may be effected by reconfiguring the diverse I/O pattern on the different dice to a common one for connection to the leadframe leads.

Yet another significant aspect of the invention is the ability to connect dice having different circuitry to a substrate or other carrier employing a standardized terminal or trace end array.

BRIEF DESCRIPTION OF THE DRAWINGS

FIG. 2 is a partial cross-sectional view of a die-and-substrate semiconductor device in accordance with the present invention;

FIG. 2A is a partial cross-sectional view of a variation of the die I/O connection structure depicted in FIG. 2;

DETAILLD OF THE ILLUSTRATED EMBODIMENT

Figure 1:
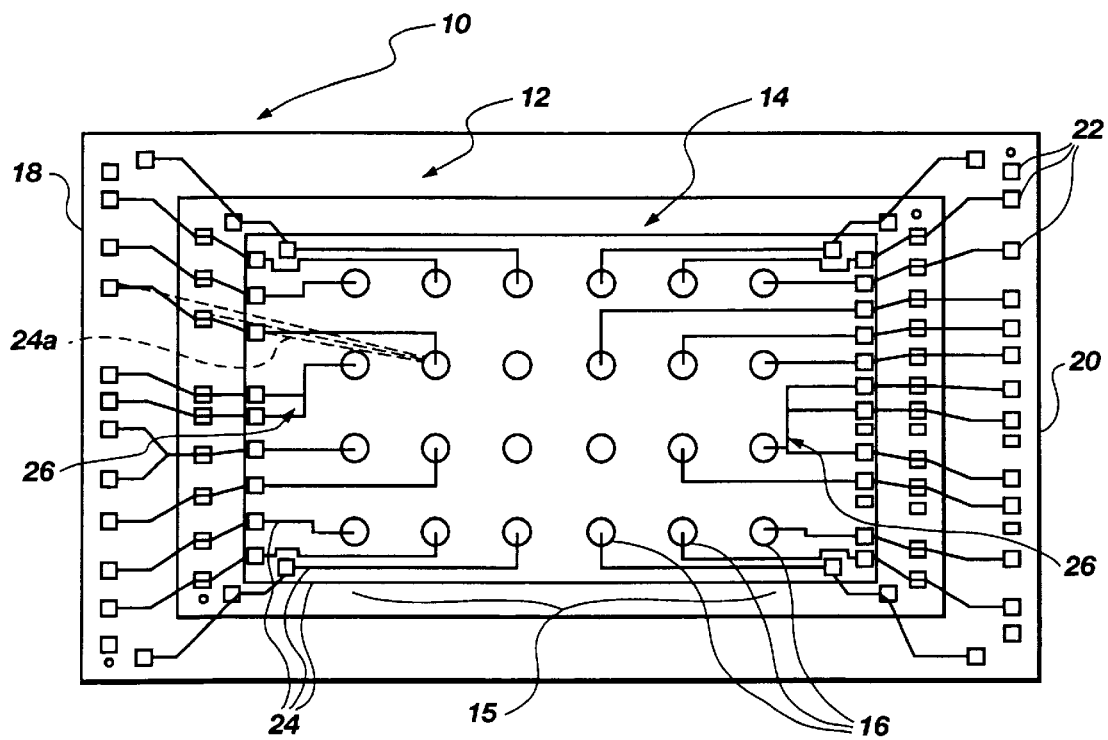
FIG. 1 is a top view of a three-generation progression of a first embodiment of a semiconductor die in accordance with the present invention.

Referring to FIG. 1, an exemplary semiconductor die 10 in accordance with the present invention is shown. The die 10 is the first generation of a series of increasingly-smaller dice 12 and 14 including the same integrated circuit, such as a DRAM. The dice 10, 12, and 14 each have an array of external connections 16 and spacing formed on their active surfaces. As can be seen, the connections 16 maintain a constant configuration and spacing for each generation of shrnking die 10, 12, and 14. That is, the size and locations of the connections 16 remain constant from one generation of die 10 to the next 12, and so on to the smallest die shrink, in this case die 14. An exemplary configuration of the external connections 16, as shown in FIG. 1, is a generally rectangular array 15 comprised of a series of substantially mutually perpendicular rows and columns of connections 16.

Proximate the first and second ends 18 and 20, respectively, of the dice 10, 12, and 14 are a plurality of die contact or connect (bond) pads 22. The pads 22 are connected to remote external connections 16 through circuit runs or traces 24 extending from selected pads 22 to the external connections 16. As shown, traces 24 may electrically connect all or a portion of the connections 16 to the pads 22. Moreover, some of the traces 24 may merge with others as shown at 26 along their paths as design requirements and preferences dictate. Because the connections 16 are in a predetermined, fixed location for each generation of die 10, 12, and 14, the traces 24 between the pads 22 and the connections 16 generally decrease in length from one generation to the next. It should be noted that traces 24 are shown extending from bond pads 22 of the first generation 10 of the dice through those of the two succeeding shrinks 12 and 14 for purposes of clarity and identification of corresponding bond pads of each die generation. However, in practice, traces 24 of each generation may be routed more directly from a bond pad 22 to its corresponding connection 16 as shown by exemplary broken line traces 24a in FIG. 1.

As shown in FIG. 2, a bare die device 30, representative of a device in accordance with the present invention, includes a semiconductor die 32 having rows of pads 34 and 36 (perpendicular to the plane of the drawing figure) proximate its ends 38 and 40, respectively. Circuit runs or traces 42 and 44 extending over a passivation layer (typically silicon dioxide or silicon nitride) on the die active surface are used to connect the pads 34 and 36 to external connections 46 and 48, respectively (such as solder or conductive epoxy balls or polymer balls containing conductive particles for forming a ball grid array (BGA), or other connectors as known in the art). Runs or traces 42, 44 may be formed by methods known in the art, such as sputtering (low melt metals), stencilling (conductive inks or polymers), or may be preformed before application to die 32 as by metallization of a polymer fihn (such as a polyimide) and formation of circuit traces thereon, such structures being commonly referred to as TAB (tape automated bonding) tape, or more generically as flex circuits. The trace material and dielectric are not critical to the invention as long as performance parameters are met.

As shown in FIG. 2, traces 42 and 44 may reside on a polymer film layer 50 and may be sandwiched between layer 50 and a cover layer 52, although neither layer is a requirement of the invention. Layers 50 and 52 may be formed of a polyimide or other suitable dielectric material, preformed or formed in situ, each such layer if employed being (by way of example) approximately 6 μm thick. As shown in FIG. 2A, traces 42 and 44 may reside on a dielectric layer 50, no cover layer 52 being employed. The FIG. 2A structure is particularly suitable for a flex circuit-type bond pad rerouting structure. The layers 50 (and 52, if used) also incidentally provide additional protection to delicate circuitry on the surface 54 of the die 32. Layers 50 and 52 may also comprise a siloxane polyinide or a spin-on glass layer, as desired.

Any substrate 60 having terminals 62 and 64 oriented to match the location of the external connections 46 and 48, respectively, may be utilized to form a bare die device 30 in accordance with the present invention. As shown, the substrate 60 may be a combination thin- and thick-film package or any other substrate known in the art, such as a printed circuit board or other chip carrier element. The substrate trace ends or other terminals, such as terminals 62 and 64, are configured to mate with the external connections 46 and 48, respectively, or vice versa. Such a substrate 60 may include ground and signal circuitry 66 and 68 and power and ground circuitry 70. Thin- or thick-film layer 72 may be comprised of polyimide, or any other suitable material known in the art, and thick-film layer 74 may comprise a ceramic material, or some other appropriate material. The substrate 60 may also include I/O pins 76 and 78 for connection to higher-level packaging. As will be understood by those in the art, most of the details of the substrate 60 are not essential to the functionality of a device 30 in accordance with the present invention, and are merely provided for illustrative purposes.

The die 32 and cooperating substrate 60 may be mutually aligned by any suitable means known in the art, such as mechanical or optical alignment systems. If the latter is used, it is desirable to provide a so-called "null point" at the center of the die in the bump pattern to serve as a reference for translational and rotational alignilent. Use of an optical system, such as a pattern recognition system, in combination with tight manufacturing tolerances, will permit use of extremely fine-pitch small ball or bump arrays in the smallest possible patterns.

FIGS. 3–8 illustrate various embodiments of the dice 10, 12, and 14 in accordance with the present invention and having varying configurations of the connections 16. (For simplification purposes, the circuit runs or traces 24 extending from tie bond pads 22 to the external connections 16 are not illustrated in FIGS. 3–8.)

Figure 3:
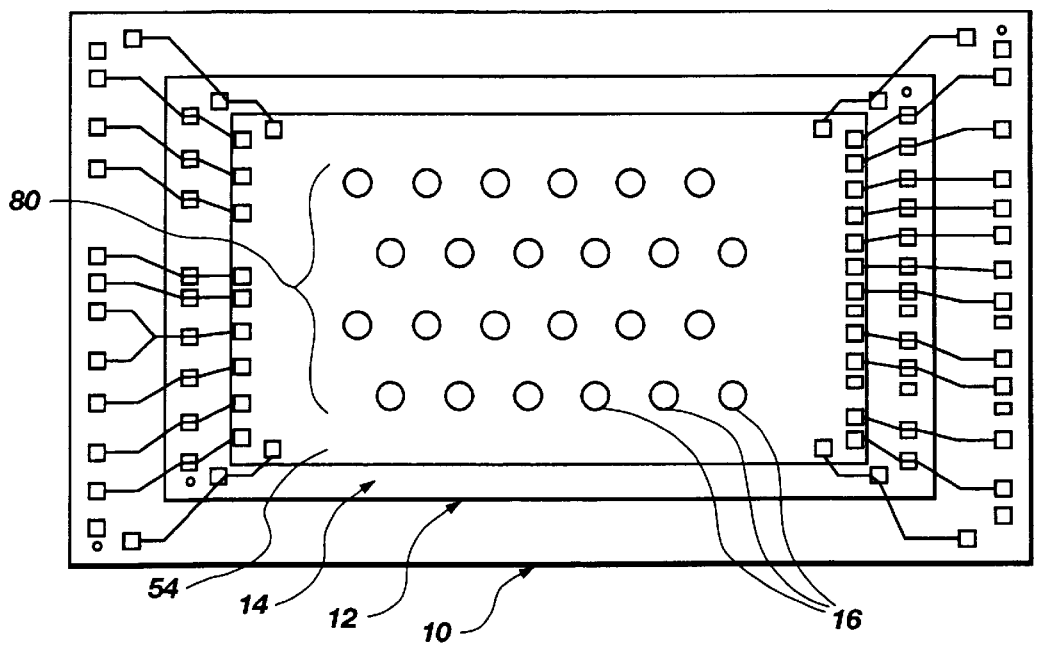
FIG. 3 is a top view of a three-generation progression of a second embodiment of a semiconductor device in accordance with the present invention.

The array 80 shown in FIG. 3 forms a staggered row pattern on the surface 54 of the dice 10, 12, 14.

Figure 4:
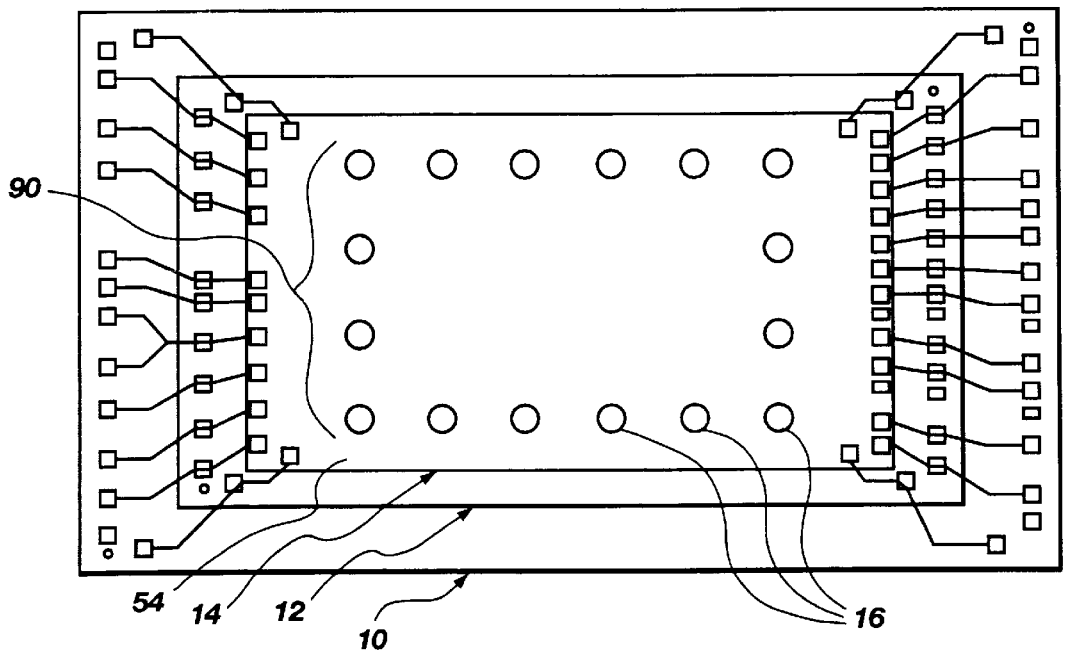
FIG. 4 is a top view of a three-generation progression of a third embodiment of a semiconductor device in accordance with the present invention.

In FIG. 4, the array 90 of external connections 16 forms the outline of a rectangle. Of course, a second, inner rectangle of connections 16 might be added.

Figure 5:
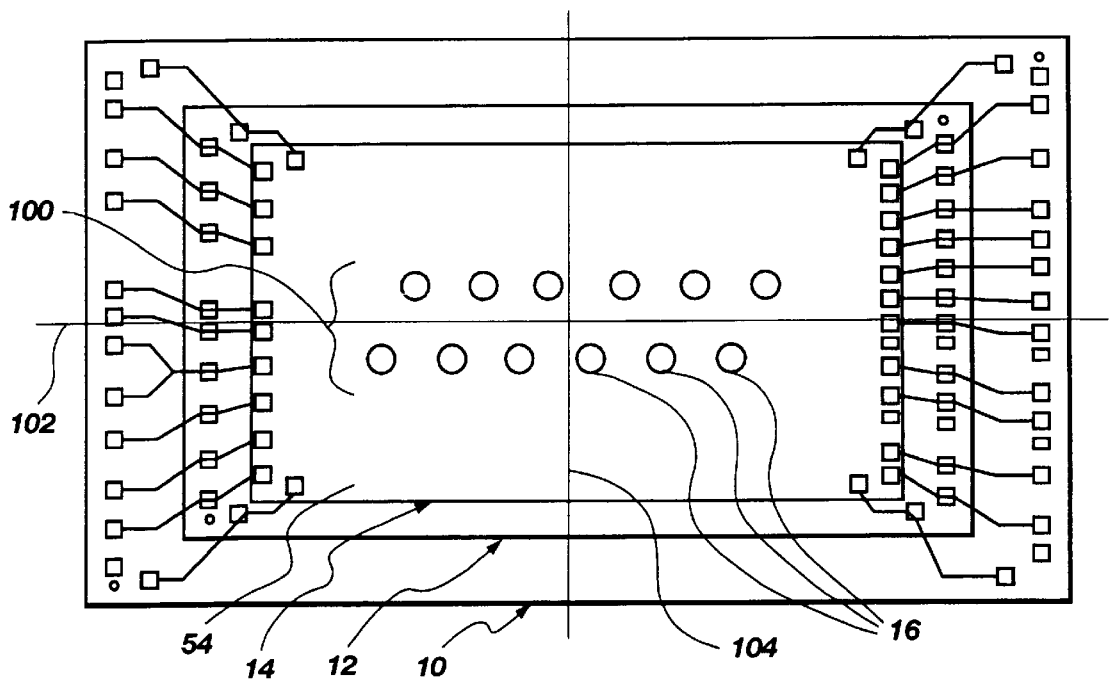
FIG. 5 is a top view of a three-generation progression of a fourth embodiment of a semiconductor device in accordance with the present invention.

In FIG. 5, the external connections 16 form an array 100 comprised of two rows cf external connections 16 adjacent and flanking the center line 102 of the die 10. Each of the connections 16 are slightly offset from corresponding connections 16 in the other row in relation to a line 104 perpendicular to center line 102.

Figure 6:
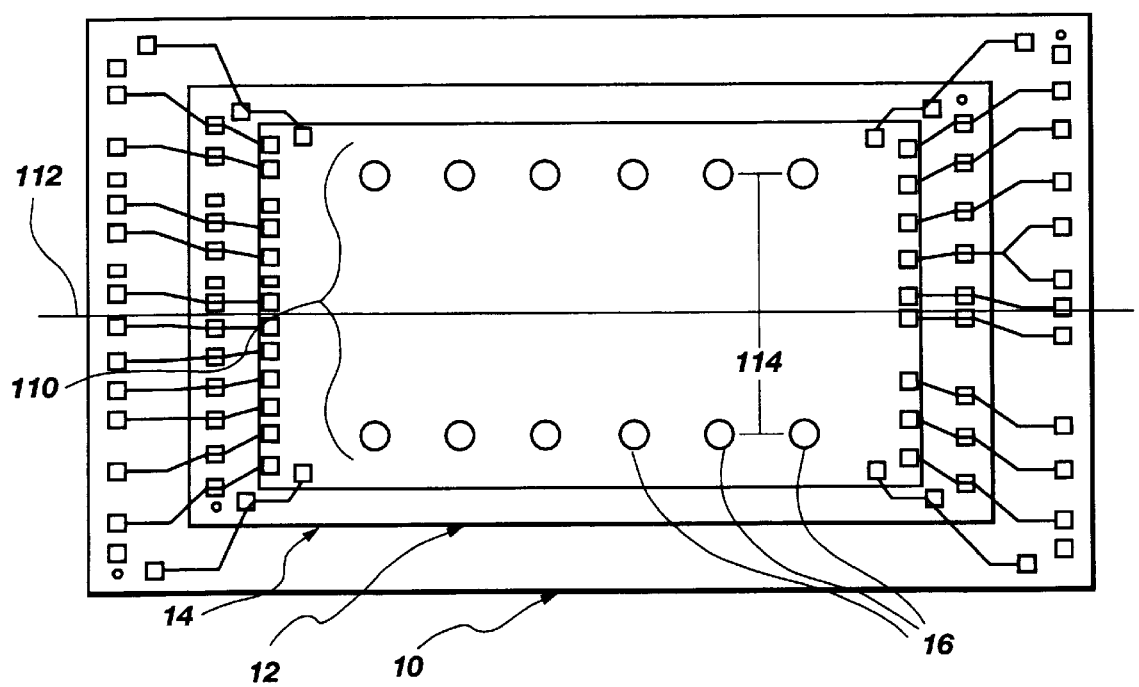
FIG. 6 is a top view of a three-generation progression of a fifth embodiment of a semiconductor device in accordance with the present invention.

Similarly, in FIG. 6, the array 110 is comprised of two rows of connections 16 where the connections 16 of one row are a mirror image of the other row about the center line 112 of the die 10 and arc separated by a distance 114 so as to be close to the periphery of third-generation die 14.

Figure 7:
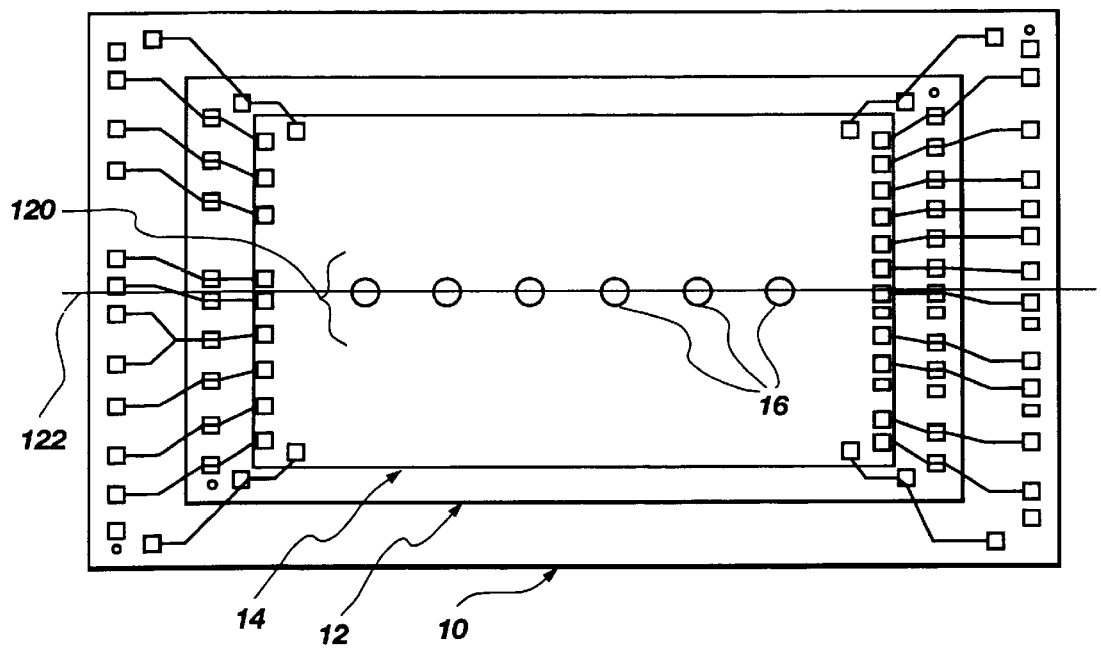
FIG. 7 is a top view of a three-generation progression of a sixth embodiment of a semiconductor device in accordance with the present invention.

In FIG. 7, the array 120 is formed by a single row of connections 16 along the center line 122. As illustrated, the array 120 is comprised of six connections 16. The number of connections 16, however, may vary, depending on design parameters and required minimum number of I/Os.

Figure 8:
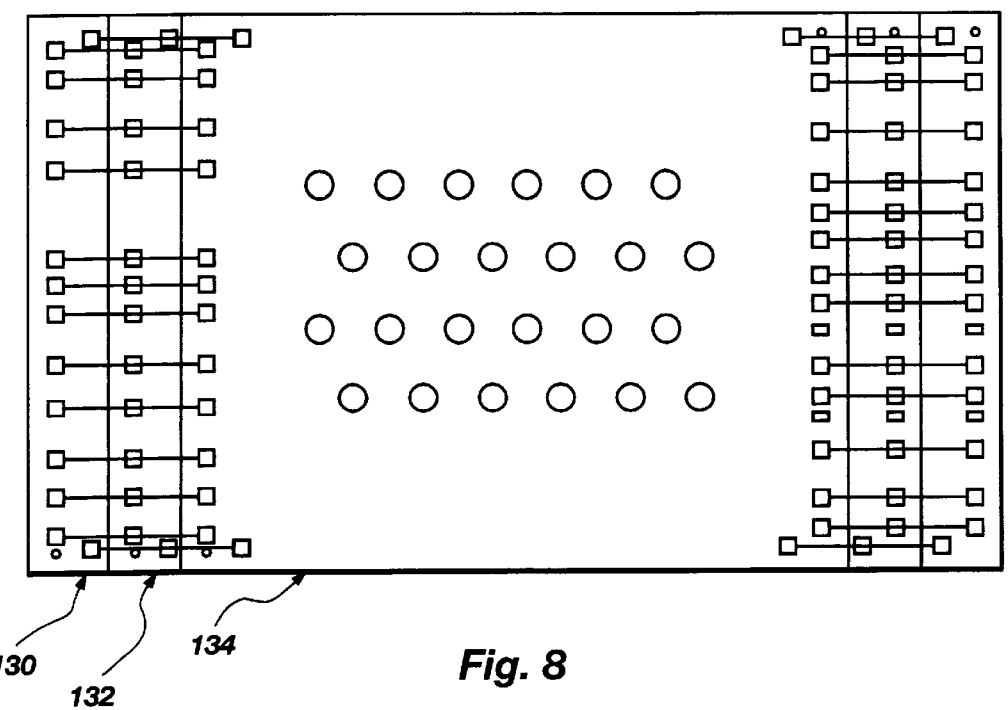
FIG. 8 is a top view of a three-generation progression of a seventh embodiment of a semiconductor device in accordance with the present invention.

FIG. 8 illustrates that the various dice 130, 132, and 134 representing three generations of die shrinks may not necessarily shrink in two or more dimensions. That is, the die 130 may simply be reduced with regard to its longitudinal length for the next generation of die 132. Similarly, the subsequent (third) generation of die 134 may only be reduced in one dimension, as illustrated.

Figure 9:
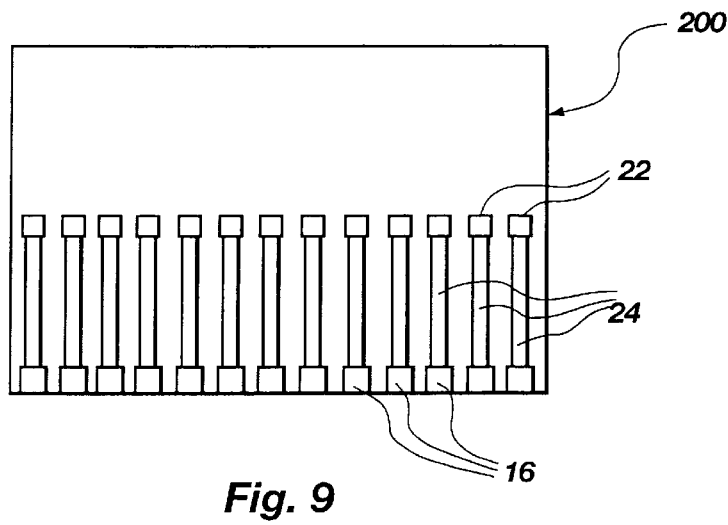
FIG. 9 is a top schematic view of a die with bond pads rerouted to I/O connections on a single edge of the die.

FIG. 9 illustrates a die 200 having a central row of bond pads 22 thereon reconfigured through the use of traces 24, as previously described, to an edge-connect configuration wherein I/O connections 16 are disposed along one side of the die. It will also be recognized that connections 16 may, in this instance, be other than conductive bumps and may (as shown) comprise plate-type contacts engagable with clip-type connectors of a carrier for a direct die connect or DDC arrangement wherein the die is inserted in a slot in the carrier, or with the leads of a single in-line package (SIP), one such structure being illustrated in U.S. Pat. No. 5,138,434, assigned to the assignee of the present invention.

Figure 10:
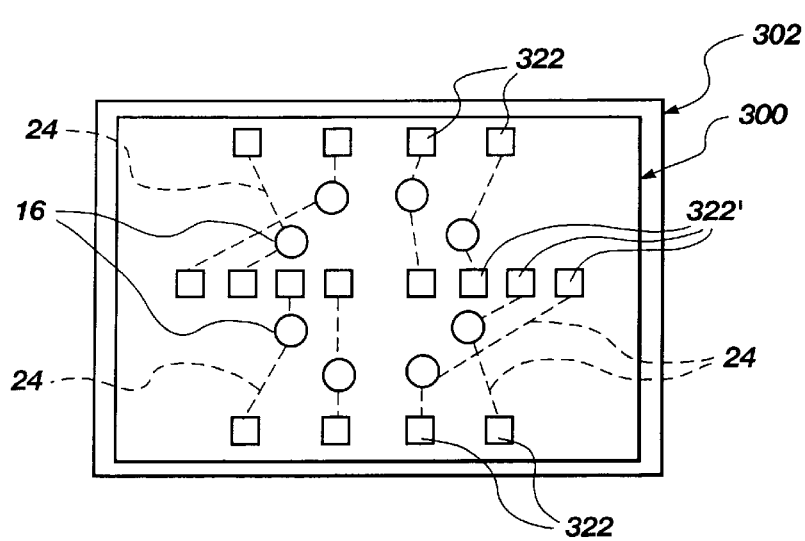
FIG. 10 is a top schematic view of two dice with different bond pads rerouted to a common circular array of I/O connections in accordance with the present invention.

FIG. 10 illustrates, for illustrative purposes, two superimposed dice 300 and 302, the first, smaller die (300) with two parallel rows of peripheral bond pads 322 and the second, larger die (302) with a central row of bond pads 322', each bond pad pattern being reconfigured into a common circular configuration or array of I/O interconnections 16 such as conductive bumps. As is shown ill broken lines 24, traces may easily be configured to extend from each set of bond pads 322, 322' of the respective diffediit die to a common array of I/O connections 16. An I/O array comprising multiple concentric connections 16 might also be employed.

Figure 11:
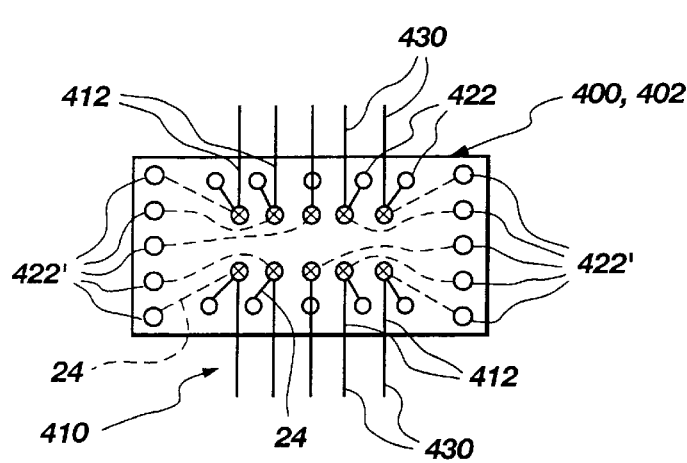
FIG. 11 is a top schematic view of two dice with different bond pads rerouted to accommodate a leadframe configured for yet another different I/O pattern and providing a common external lead configuration.

FIG. 11 illustrates two exemplary superimposed dice 400 and 402 of the saine size, each die with a respective different arrangement of bumped bond pads 422 and 422', mountable to a leadframe 410, the inner lead ends 412 of the leadframe 410 being configured to accommodate a common, rerouted I/O pattern (cross-hatched) employed with both die and to provide a common I/O arrangement of external lead ends 430 for connection to a substrate or other carrier. Bond pads 422 have been rerouted by traces 24 shown in solid lines, while bond pads 422' have been rerouted by traces 24 shown in broken lines. It will be understood that only one die I/O pattern need be rerouted if the leadframe is configured to match the I/O pattern of the other die. It will be appreciated, however, that, in some instances, the I/O patterns of both dice are desirably rerouted. FIG. 11 is also illustrative of the use of two face-to-face dice mounted, if desired, on opposing sides of a leadframe in a lead-between-chip (LBC) arrangement, and the manner in which LBC is facilitated by the invention.

It is contemplated that the use of a standardized die-to-substrate connection array is adaptable to conform different-sized dice and dice with different circuitry to standardized packaging employed by the industry for connection of a variety of die to carriers such as printed circuit boards. For example, a substrate configured as an insert having external leads or other terminal or pin elements extending therefrom and a standardized array of terminals may receive and carry any die having a matching bump configuration, regardless of its size, origin, or even the type of integrated circuits carried thereon. For example, using the invention, a die with a peripheral bond pad arrangement may be substituted for one employing a central row of bond pads. Thus, a substrate configured with external leads for a small-outline J-lead package may carry any matching-connection die. The substrate may, in fact, be a leads-under-chlip (LUC) or leads-over-chip (LOC) design leadframe, with inner lead ends configured as pads and suitably plated, if necessary, to bond with the connection bumps of the die. Of course, the aforementioned LBC arrangement with two facing dice and an interposed leadframe is also a viable arrangement. The resulting assembly may then be packaged, as by transfer molding of a plastic package. Alternatively, an insulative substrate defining a die carrier area with a terminal array and including leads, such as a ceramic substrate with leads extending therefrom, may receive a bumped die and a cover or other protection, such as a glob-top, preformed cover, or a dammed silicone gel, may be placed thereover. An insulative underfll may be employed between the die and substrate.

Those skilled in the art will appreciate that the layout of external connections for a semiconductor die according to the invention may be independent of the substrate and/or die materials used or the internal circuit configurations thereof. It will also be appreciated by one of ordinary skill in the art that one or more features of one of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defmed in the appended claims. For example, various additional array configurations may be utilized; the number of generations of die shrinks employing a single standardized array may be increased or decreased; the number of external connections may vary; and the form of the dice-size reduction may be altered to include one-dimensional shrinking in the plane of the die. Thie invention may be employed with functionally different die mateable with the same substrate. For example, a SIMM (single in-line memory module) and a plug-in processor may be employed on a common design of daughter board, which in turn is connectable to a mother board. Only some of the bond pads of a die may be rerouted as desired, for example to power and ground, to simplify external connections.

What is claimed is:

1. A method of fabricating semiconductor devices, comprising:

providing a plurality of substrates, each substrate of the plurality bearing at least one arrangement of terminals in a selected pattern on a surface thereof;

providing a plurality of semiconductor dice each having active surfaces with a pattern of external connections thereover, each of at least two semiconductor dice of the plurality of semiconductor dice exhibiting a pattern of external connections over the active surface thereof inconsistent by a location of at least one external connection with the selected pattern of terminals, wherein the patterns of external connections of the at least two semiconductor dice are mutually different by a location of at least one external connection;

altering the pattern of external connections of each semiconductor die of the at least two semiconductor dice to be consistent with the selected pattern of terminals by rerouting the at least one external connection on each of the at least two semiconductor dice over the active surface thereof; and operably connecting the external connections of each semiconductor die of the plurality of semiconductor dice to terminals of a substrate.

2. The method of claim 1, wherein at least some of the semiconductor dice of the plurality differ in at least one of size, shape and circuitry.

3. The method of claim 1, wherein the pattern of external connections of at least one semiconductor die of the at least two semiconductor dice is inconsistent by a plurality of external connection locations with the selected pattern of terminals, and further comprising rerouting the plurality of external connections of the at least one semiconductor die to be consistent with the selected pattern of terminals.

4. The method of claim 3, wherein all of the external connections of the pattern of external connections of the at least one semiconductor die are inconsistent with the selected pattern of terminals, and further comprising rerouting sufficient external connections of the at least one semiconductor die to be consistent with the selected pattern of terminals.

5. The method of claim 1, further comprising forming conductive bumps on the semiconductor dice to effect operable connections between the external connections and the substrate terminals.

6. The method of claim 1, wherein the substrates comprise leadframes and the terminals comprise lead fingers, and operably connecting comprises aligning at least one semiconductor die in superimposition with each leadframe and bonding at least some of the external connections to at least some of the lead fingers.

7. The method of claim 6, further comprising aligning two semiconductor dice on opposing sides of the leadframes in superimposition therewith and bonding at least some of the external connections of each of the two semiconductor dice with at least some of the lead fingers.

* * * * *